(12) United States Patent
Kawakami et al.

(10) Patent No.: US 12,362,143 B2
(45) Date of Patent: Jul. 15, 2025

(54) PLASMA PROCESSING APPARATUS AND PLASMA PROCESSING METHOD

(71) Applicant: TOKYO ELECTRON LIMITED, Tokyo (JP)

(72) Inventors: Satoru Kawakami, Nirasaki (JP); Tadashi Mitsunari, Nirasaki (JP); Shinya Iwashita, Nirasaki (JP); Yusuke Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 814 days.

(21) Appl. No.: 17/288,415

(22) PCT Filed: Oct. 15, 2019

(86) PCT No.: PCT/JP2019/040363
§ 371 (c)(1),
(2) Date: Apr. 23, 2021

(87) PCT Pub. No.: WO2020/090427
PCT Pub. Date: May 7, 2020

(65) Prior Publication Data
US 2021/0384009 A1 Dec. 9, 2021

(30) Foreign Application Priority Data
Oct. 29, 2018 (JP) .................. 2018-202556

(51) Int. Cl.
*H01J 37/32* (2006.01)
*C23C 16/455* (2006.01)
*C23C 16/52* (2006.01)

(52) U.S. Cl.
CPC ......... *H01J 37/32174* (2013.01); *C23C 16/45544* (2013.01); *C23C 16/52* (2013.01);
(Continued)

(58) Field of Classification Search
None
See application file for complete search history.

(56) References Cited

U.S. PATENT DOCUMENTS

| | | | |
|---|---|---|---|
| 6,353,201 B1* | 3/2002 | Yamakoshi | H05H 1/46 315/111.41 |
| 9,711,375 B2* | 7/2017 | Terauchi | H01J 37/32174 |
| 2002/0007793 A1* | 1/2002 | Sakai | H01J 37/32009 118/723 E |

(Continued)

FOREIGN PATENT DOCUMENTS

| | | |
|---|---|---|
| JP | 2004-96066 A | 3/2004 |
| JP | 2015-26475 A | 2/2015 |

(Continued)

OTHER PUBLICATIONS

PCT International Search Report and Written Opinion, PCT Application No. PCT/JP2019/040363, Jan. 7, 2020, 12 pages (with English translation of PCT International Search Report).

*Primary Examiner* — Sylvia MacArthur
(74) *Attorney, Agent, or Firm* — Fenwick & West LLP

(57) ABSTRACT

In a plasma processing apparatus, a processing chamber is provided. First electrodes are disposed inside the processing chamber and supplied with radio frequency powers. The second electrode is disposed inside the processing chamber and functions as a counter electrode for the first electrodes. The power supply source supplies radio frequency powers to the first electrodes to generate plasma between the first electrodes and the second electrode and process a target object using the plasma. The allocation setting unit is disposed between the power supply source and at least one of the first electrodes to set power allocations of the radio frequency powers to be supplied to the first electrodes. Further, the allocation setting unit has series circuits in each of which an impedance circuit and a switching element are connected in series. The series circuits are connected in (Continued)

parallel. The control device controls the switching elements in the series circuits.

12 Claims, 11 Drawing Sheets

(52) U.S. Cl.
CPC .............. *H01J 37/32091* (2013.01); *H01J 37/32568* (2013.01); *H01J 2237/24564* (2013.01); *H01J 2237/332* (2013.01)

(56) References Cited

U.S. PATENT DOCUMENTS

| | | | | |
|---|---|---|---|---|
| 2005/0022933 | A1* | 2/2005 | Howard | H01J 37/32165 156/345.43 |
| 2009/0246942 | A1* | 10/2009 | Imaeda | C23C 16/515 257/E21.09 |
| 2010/0025372 | A1* | 2/2010 | Tsujimoto | H01J 37/32091 156/345.28 |
| 2012/0247390 | A1* | 10/2012 | Sawada | H01J 37/32633 118/723 AN |
| 2016/0079037 | A1* | 3/2016 | Hirano | H01J 37/32183 156/345.28 |
| 2017/0241021 | A1* | 8/2017 | Tabata | C23C 16/503 |
| 2017/0372910 | A1* | 12/2017 | Tanaka | H01L 21/3065 |
| 2018/0374684 | A1* | 12/2018 | Collins | C23C 16/45536 |
| 2021/0384009 | A1* | 12/2021 | Kawakami | C23C 16/45544 |

FOREIGN PATENT DOCUMENTS

| | | |
|---|---|---|
| JP | 2017-228395 A | 12/2017 |
| KR | 10-1054558 B1 | 8/2011 |

\* cited by examiner

PLASMA PROCESSING APPARATUS AND PLASMA PROCESSING METHOD

TECHNICAL FIELD

Various aspects and embodiments of the present disclosure relate to a plasma processing apparatus and a plasma processing method.

BACKGROUND

A device manufacturing process includes processing using plasma. In the processing using plasma, the plasma distribution affects the uniformity of the processing and the like, so that it is important to accurately control the plasma distribution. As one example of the methods for controlling the plasma distribution, there is a method for dividing a substantially disc-shaped upper electrode facing a lower electrode on which a target object is placed into an inner electrode and an outer electrode in a radial direction of the upper electrode and controlling a ratio between two radio frequency powers respectively supplied to both electrodes.

For example, in a technique disclosed in Patent Document 1, a ratio between radio frequency powers supplied to an inner electrode and an outer electrode is controlled by changing a capacitance of a variable capacitor disposed between a radio frequency power supply and the inner electrode through a stepper motor. Accordingly, the plasma distribution in a radial direction of a substantially disc-shaped target object can be controlled to a desired distribution.

Patent Document 1: Japanese Patent Application Publication No. 2015-26475

SUMMARY

The present disclosure provides a plasma processing apparatus and a plasma processing method capable of controlling the distribution of plasma at a higher speed.

In accordance with an aspect of the present disclosure, there is provided a plasma processing apparatus including: a processing chamber accommodating a target object to be processed; a plurality of first electrodes disposed inside the processing chamber, radio frequency powers being supplied to the first electrodes; a second electrode disposed inside the processing chamber, the second electrode functioning as a counter electrode that faces the first electrodes; a power supply source configured to supply the radio frequency powers to the first electrodes to generate plasma between the first electrodes and the second electrode and process the target object using the generated plasma; an allocation setting unit disposed between the power sup source and at least one of the first electrodes, the allocation setting unit being configured to set power allocations of the radio frequency powers to be respectively supplied to the first electrodes from the power supply source; and a control device configured to control the allocation setting unit. The allocation setting unit has a plurality of series circuits, in each of which an impedance circuit and a switching element are connected in series. Further, the plurality of series circuits are connected in parallel, and the control device controls the switching elements in the respective series circuits.

Effect of the Invention

In accordance with various aspects and embodiments of the present disclosure, the plasma distribution can be controlled at a higher speed.

DETAILED DESCRIPTION

Hereinafter, embodiments or plasma processing apparatus and a plasma processing method of the present disclosure will be described in detail with reference to the accompanying drawings. The following embodiments are not intended to limit the plasma processing apparatus and the plasma processing method of the present disclosure. Further, the respective embodiments can be appropriately combined without contradicting processing contents.

In atomic layer deposition (ALD), in which a film forming cycle including an adsorption process, a purge process, and a modifying process is repeated, plasma may be used in the modifying process. Further, in recent ALD, a processing time of one film forming cycle and a processing time of the modifying process have been shortened to improve throughput. For example, the processing time of one film forming cycle may be 1 sec or less, and the processing time of one modifying process may be 0.5 sec or less.

When the film forming cycle is executed, the amount of reaction by-products (so-called deposits) adhered to an inner portion of a processing apparatus is changed and, thus, an inner environment of the processing apparatus may be changed and plasma distribution may be changed. Accordingly, in each film formation cycle, the plasma distribution may be controlled depending on the amount of deposits. Further, the plasma distribution in each film formation cycle of ALD may be intentionally changed depending on characteristics of a device to be manufactured.

However, in the case where a capacitance of a variable capacitor is changed by changing a physical position using a stepper motor to control a ratio between radio frequency powers, it is difficult to change the plasma distribution for every film forming cycle that is performed in a short period of time. Therefore, the present disclosure provides a technique capable of controlling the plasma distribution at a higher speed.

First Embodiment

<Configuration of Film Forming Apparatus 10>

Figure 1:
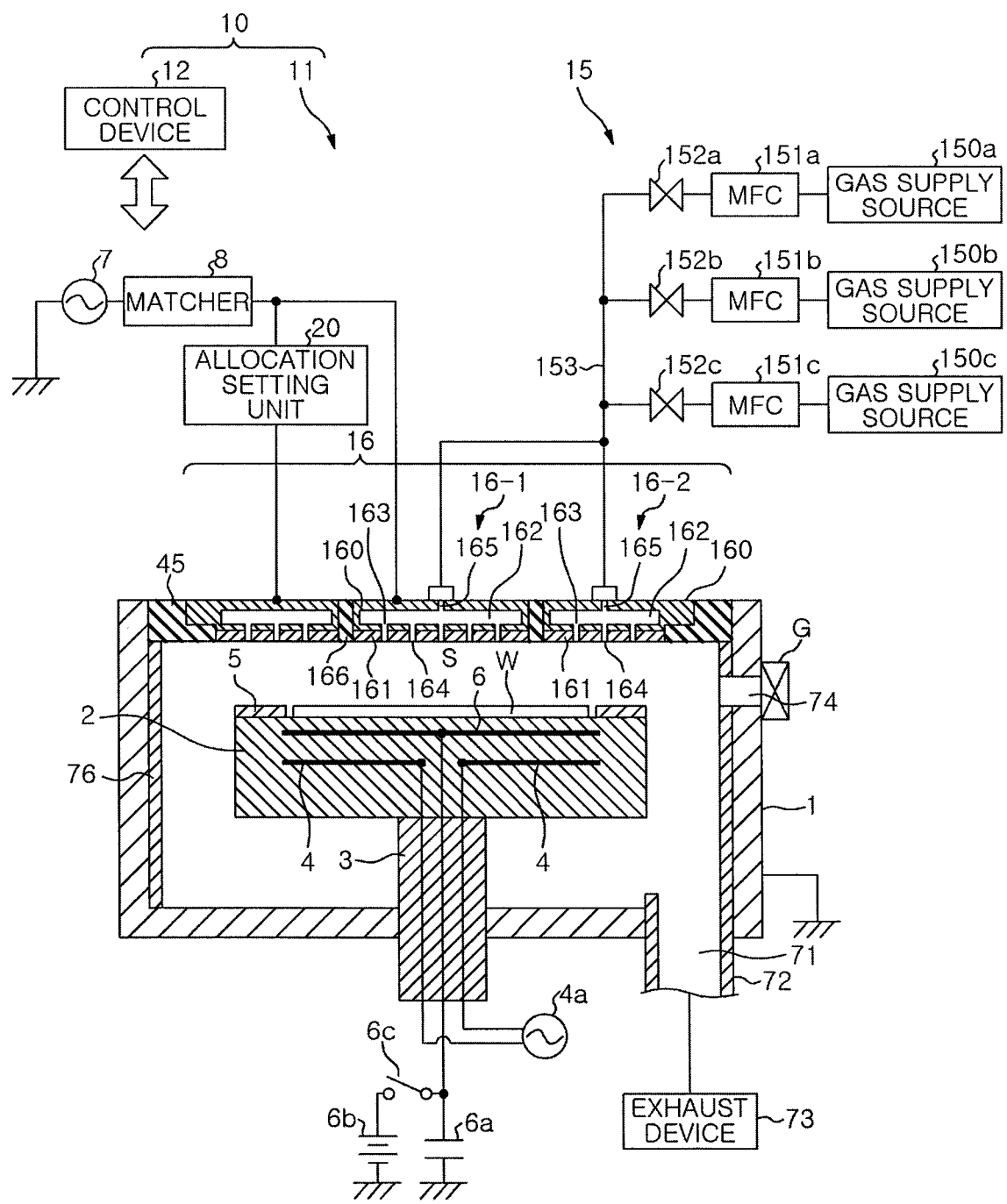
FIG. 1 is a cross-sectional view schematically showing an example of a film forming apparatus according to a first embodiment of the present disclosure.

FIG. 1 is a cross-sectional view schematically showing an example of a film forming apparatus 10 according to first embodiment of the present disclosure. The film forming apparatus 10 in the first embodiment includes an apparatus main body 11 and a control device 12. The apparatus main body 11 is, e.g., a capacitively coupled parallel plate plasma ALD apparatus. The film forming apparatus 10 is an example of a plasma processing apparatus. The apparatus main body 11 has, e.g., a processing chamber 1 having a surface made of anodically oxidized aluminum and having a substantially cylindrical inner space. Alternatively, the processing chamber 1 may be made of pure aluminum, aluminum sprayed with ceramic, or the like. The processing chamber 1 is frame-grounded.

The processing chamber 1 includes therein a stage 2 on which a target object W to be processed is placed. The stage 2 is made of, for example, ceramic, aluminum, or a combination thereof, and is supported by a support member 3. An electrode 6 and a plurality of heaters 4 are disposed in the stage 2. The electrode 6 is grounded through a blocking capacitor 6a. Further, a DC power supply 6b is connected to the electrode 6 through a switch 6c. A heater power supply 4a is connected to each of the heaters 4. A sidewall of the processing chamber and the stage 2 are examples of a second electrode.

The target object W is placed on an upper surface of the stage 2. Then, the target object W is attracted and held on the upper surface of the stage 2 by an electrostatic force generated on the surface of the stage 2 by a DC voltage supplied from the DC power supply 6b. Each of the heaters 4 generates heat by an electric power supplied from the heater power supply 4a, and heats the target object 51 attracted and held on the upper surface of the stage 2.

An edge ring 5 made of, for example, ceramic or the like is disposed on the upper surface of the stage 2. The edge ring 5 improves uniformity of plasma processing on a surface of the target object W. Instead of the edge ring 5, an upper surface portion of the stage 2, on which the target object W is placed, may have a pocket shape engraved along the shape of the target object W.

An exhaust port 71 is disposed at a bottom portion of the processing chamber 1. An exhaust device 73 is connected to the exhaust port 71 through an exhaust pipe 72. The exhaust device 73 has a vacuum pump and is configured to reduce a pressure in the processing chamber 1 to a desired vacuum level.

An opening 74 is formed at the sidewall of the processing chamber 1. The opening 74 is opened and closed by a gate valve G. Further, a deposition shield 76 is detachably disposed along an inner wall surface of the processing chamber 1. The deposition shield 76 prevents the reaction by-products (deposits) from being directly adhered to the inner wall of the processing chamber 1. Further, the deposition shield 76 prevents damage to the processing chamber 1 at the time of cleaning the reaction by-products adhered to the inner wall of the processing chamber 1.

An upper electrode 16 is disposed above the stage 2 to be opposed to the stage 2. The stage 2 and the upper electrode 16 are disposed in the processing chamber 1 to be substantially parallel each other. In the following description, a space between the target object W placed on the stage 2 and a bottom surface of the upper electrode 16 will be referred to as a processing space S.

The upper electrode 16 is supported at an upper portion of the processing chamber 1 via an insulating member 45. The upper electrode 16 is divided into an upper electrode 16-1 and an upper electrode 16-2 disposed around the upper electrode 16-1. In the first embodiment, each of the upper electrode 16-1 and the upper electrode 16-2 has a substantially disc shape, and the central axis of the upper electrode 16-1 and the central axis of the upper electrode 16-2 coincide with each other. The upper electrode 16-1 and the upper electrode 16-2 are insulated by an insulating member 166.

Each of the upper electrode 16-1 and the upper electrode 16-2 has a ceiling plate holder 160 and an upper ceiling plate 161. The ceiling plate holder 160 is made of, for example, aluminum having an anodically oxidized surface.

A diffusion space 162 is formed in each ceiling plate holder 160. Further, multiple gas holes 163 communicating with the diffusion space 162 are formed at the bottom portion of each ceiling plate holder 160. Further, each ceiling plate holder 160 is provided with a gas inlet port 165 for introducing a processing gas into the diffusion space 162. A gas supply mechanism 15 is connected to each gas inlet port 165 through a pipe 153.

The gas supply mechanism 15 includes a plurality of gas supply sources 150a to 150c, a plurality of mass flow controllers (MFC) 151a to 151c, and a plurality of valves 152a to 152c. The gas supply source 150a is a source of a precursor gas. The precursor gas for example, bis(diethylamino)silane ($H_2Si[N(C_2H_5)_2]_2$) gas, dichlorosilane ($SiH_2Cl_2$) gas, or the like. The gas supply source 150b is a source of a purge gas. The purge gas is, for example, Ar gas or He gas. The gas supply source 150c is a source of a modifying gas. The modifying gas is, for example, $O_2$ gas, $H_2O$ gas, $NH_3$ gas, $N_2$ gas, $H_2$ gas, or the like.

The MFC 151a controls a flow rate of the precursor gas supplied from the gas supply source 150a. The MFC 151b controls a flow rate of the purge gas supplied from the gas supply source 150b. The MTC 151c controls a flow rate of the modifying gas supplied from the gas supply source 150c.

The valve 152a controls the start and stop of supply of the precursor gas whose flow rate is controlled by the MFC 151a to the upper electrode 16. The valve 152b controls the start and stop of the supply of the purge gas whose flow rate is controlled by the MFC 151b to the upper electrode 16. The valve 152c controls the start and stop of the supply of the modifying whose flow rate is controlled by the MFC 151c to the upper electrode 16.

Further, multiple gas injection holes 164 formed through each upper ceiling plate 161 in a thickness direction of the upper ceiling plate 161. The gas injection holes 164 communicate with the gas holes 163, respectively. The gas supped into the diffusion space 162 through the gas inlet port 165 is diffused in the diffusion space 162, and is supplied in a shower pattern into the processing space S of the processing chamber 1 through the gas holes 163 and the gas injection holes 164.

A radio frequency power supply 7 is connected to the ceiling plate holder 160 of the upper electrode 16-1 through a matcher 8. The radio frequency power supply is also connected to the ceiling plate holder 160 of the upper electrode 16-2 through an allocation setting unit 20 and the matcher 8. The radio frequency power supply 7 supplies a radio frequency power of a predetermined frequency (e.g., 13.56 MHz) used for plasma generation to each ceiling plate holder 160. The ceiling plate holder 160 of each upper electrode 16 is an example of each of a plurality of first electrodes, and the radio frequency power supply 7 is an example of a power supply source. In the first embodiment, the allocation setting unit 20 is provided only between the matcher 8 and the upper electrode 16-2. However, in another embodiment, the allocation setting unit 20 may also be provided between the matcher 8 and the upper electrode 16-1.

The allocation setting unit 20 sets an allocation ratio of the radio frequency power to be supplied to the upper electrode 16-1 and the radio frequency power to be supplied to the upper electrode 16-2 under the control of the control device 12. Accordingly, the radio frequency powers are applied to the upper electrode 16-1 and the upper electrode 16-2 at the allocation ratio set by the allocation setting unit 20.

The upper electrode 16 is provided with a temperature adjusting mechanism such as a heater (not shown) or a pipe (not shown) for circulating a coolant, and thus can be controlled to be within a desired temperature range during the processing of the target object W. Further, a negative DC voltage may be applied to the upper electrode 16 through a low-pass filter (LPF), if necessary, when plasma is generated in the processing space S.

The apparatus main body 11 configured as described above is controlled by the control device 12. The control device 12 includes a memory, a processor, and an input/output interface. The processor reads and executes programs stored in the memory to controls the individual components of the apparatus main body 11 through the input/output interface based on recipes or data stored in the memory.

<Configuration of the Allocation Setting Unit 20>

Figure 2:
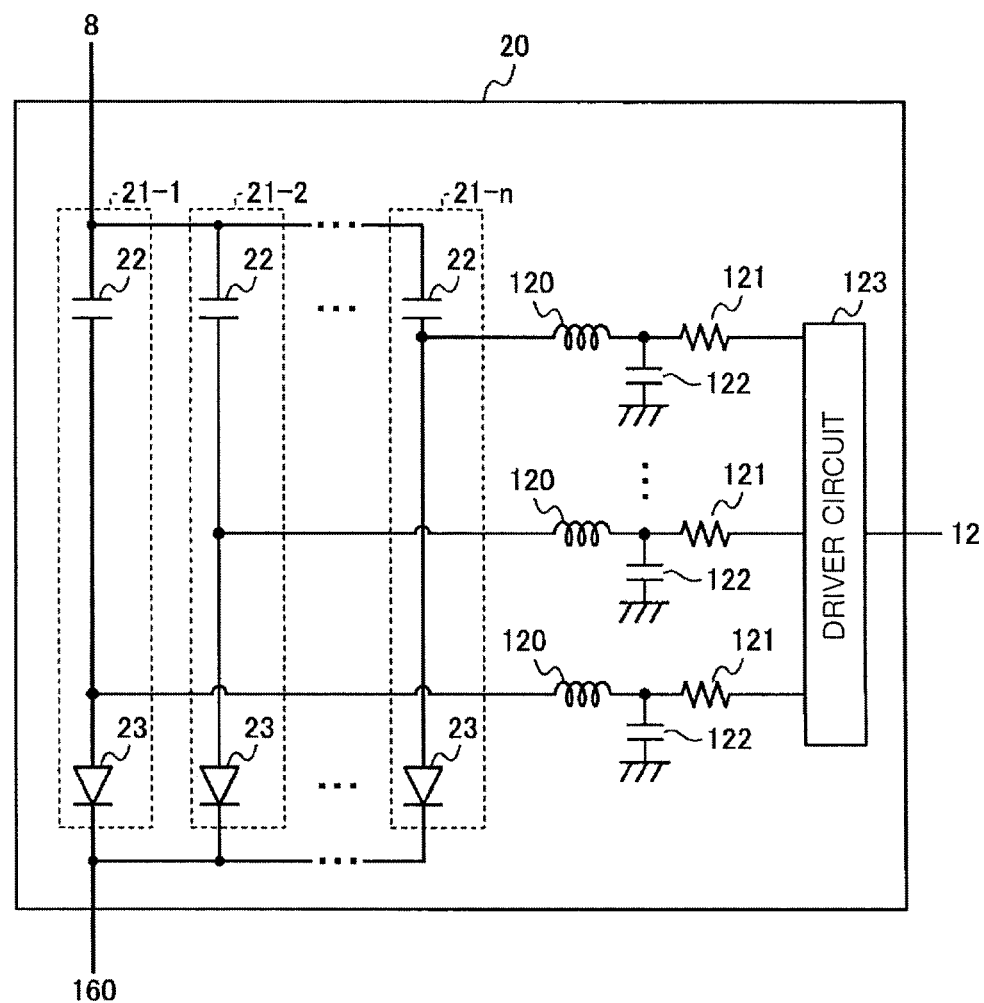
FIG. 2 is a block diagram showing an example of an allocation setting unit.

FIG. 2 is a block diagram showing an example of the allocation setting unit 20. As shown in FIG. 2, for example, the allocation setting unit 20 includes a plurality of series circuits 21-1 to 21-n, a plurality of inductors 120, a plurality of resistors 121, a plurality of capacitors 122, and a driver circuit 123. The series circuits 21-1 to 21-n are connected in parallel to each other between the matcher 8 and the ceiling plate holder 160 of the upper electrode 16-2. In the following description, the series circuits 21-1 to 21-n will be collectively referred to as a series circuit 21 unless otherwise stated.

Each series circuit 21 has a capacitor 22 and a diode 23. In the first embodiment, the diode 23 is, for example, a PIN diode. The capacitor 22 is an example of an impedance circuit and the diode 23 is an example of a switching element. In another embodiment, the capacitor 22 may be replaced with a circuit including, e.g., at least one of a capacitor and an inductor. Further, the diode 23 may be replaced with a switch using at least one of a diode and a transistor.

In each series circuit 21, one end of the capacitor 22 is connected to the matcher 8; the other end of the capacitor 22 is connected to an anode of the diode 23; and a cathode of the diode 23 is connected to the ceiling plate holder 160 of the upper electrode 16-2. Alternatively, in each series circuit 21, the anode of the diode 23 may be connected to the matcher 8; the cathode of the diode 23 may be connected to one end of the capacitor 22; and the other end of the capacitor 22 may be connected to the ceiling plate holder 160 of the upper electrode 16-2.

Further, in each series circuit 21, the anode of the diode 23 is connected to the driver circuit 123 through the inductor 120 and the resistor 121 connected in series. A node between the inductor 120 and the resistor 121 is grounded through the capacitor 122. The inductor 120 and the capacitor 122 form the low-pass filter (LPF). The driver circuit 123 includes a diode switch driver circuit and a high-voltage DC power supply circuit, and is controlled by the control device 12. In each series circuit 21, the diode 23 is turned on or off by applying a positive bias voltage or a negative bias voltage from the driver circuit 123 through the resistor 121 and the LPF including the inductor 120 and the capacitor 122, and the radio frequency power is supplied from the matcher 8 to the ceiling plate holder 160 through the capacitor 22.

In the first embodiment, the constants of the capacitors 22 of the respective series circuit 21 are the same, and the control device 12 controls the number of diodes 23 to be turned on to control the impedance between the matcher 8 and the ceiling plate holder 160 of the upper electrode 16-2. Therefore, the ratio of the impedance between the matcher 8 and the ceiling plate holder 160 of the upper electrode 16-1 and the impedance between the matcher 8 and the ceiling plate holder 160 of the upper electrode 16-2 is controlled. Accordingly, the allocation ratio of the radio frequency power to be supplied to the ceiling plate holder 160 of the upper electrode 16-1 and the radio frequency power to be supplied to the ceiling plate holder 160 of the upper electrode 16-2 is controlled.

Here, if the impedance between the radio frequency power supply 7 and the ceiling plate holder 160 is changed using a variable capacitor whose capacitance is changed by changing a physical position of a movable electrode with respect to a fixed electrode using a motor or the like, it is difficult to change the impedance in a short period of time. Therefore, it is difficult to change the allocation ratio of the radio frequency power to be supplied to the ceiling plate holder 160 of the upper electrode 16-1 and the radio frequency power to be supplied to the ceiling plate holder 160 of the upper electrode 16-2 in a short period of time. Accordingly, it is difficult to change the distribution of plasma generated in the processing chamber 1 at a high speed.

On the other hand, in the allocation setting unit 20 of the first embodiment, the impedance between the radio frequency power supply 7 and each ceiling plate holder 160 can be changed by the bias voltage supplied from the driver circuit 123 through the resistor 121 and the LPF including the inductor 120 and the capacitor 122. Hence, it is possible to change the allocation ratio of the radio frequency power to be supplied to the ceiling plate holder 160 of the upper electrode 16-1 and the radio frequency power to be supplied to the ceiling plate holder 160 of the upper electrode 16-2 in a short period of time. Accordingly, the distribution of the plasma generated in the processing chamber 1 can be changed at a high speed.

In the first embodiment, the control device 12 holds in advance the number of diodes 23 to be turned on for each plasma distribution. Further, the control device 12 controls the allocation setting unit 20 based on the processing recipe to turn on the number of diodes 23 corresponding to each plasma distribution that is specified in the processing recipe.

In another embodiment, when the capacitance of the capacitor 22 of the series circuit 21-1 is set to $C_1$, the capacitance of the capacitor 22 of each series circuit 21 may be set such that a capacitance $C_k$ of the capacitor 22 of a $k^{th}$ series circuit 21-$k$ becomes a capacitance expressed by the following equation (1):

$$C_k = 2^{k-1} C_1 \qquad \text{Equation (1)}$$

where k is an integer greater than or equal to 2 and smaller than or equal to n.

In still another embodiment, the control device 12 may control the impedance between the matcher 8 and the ceiling plate holder 160 of the upper electrode 16-2 based on the capacitance specified by, for example, the following equation (2):

$$C = m_1 C_1 + m_2 C_2 + \ldots m_n C_n \qquad \text{Equation (2)}.$$

In the above equation (2), $m_k$ is a variable that becomes 1 when the diode 23 of the $k^{th}$ series circuit 21 is turned on and becomes 0 when the diode 23 of the $k^{th}$ series circuit 21 is turned off. Accordingly, the control device 12 can control the capacitance C between the matcher 8 and the ceiling plate holder 160 of the upper electrode 16-2 to a desired capacitance by the resolution of the capacitance $C_1$.

<Film Forming Process>

Figure 3:
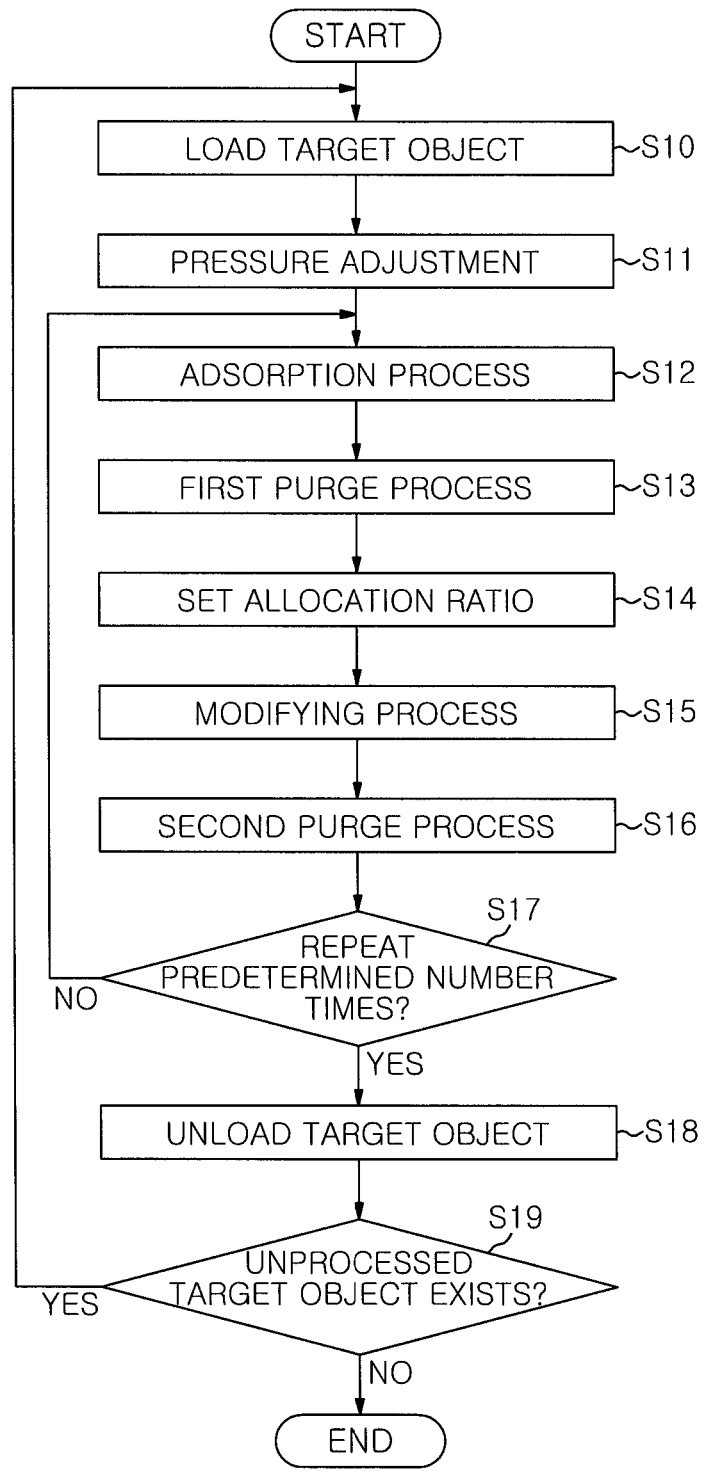
FIG. 3 is a flowchart showing an example of a film forming process according to the first embodiment of the present disclosure.

FIG. 3 is a flowchart showing an example of a film forming process, in the first embodiment of the present disclosure. In the first embodiment, the film forming apparatus 10 is configured to form a predetermined laminated film (e.g., a silicon oxide film) on the target object 51 using ALD. The film forming process illustrated in FIG. 3 is executed by controlling the individual components of the apparatus main body 11 under the control or the control device 12.

First, the gate valve G is opened, and an unprocessed target object W is loaded into the processing chamber 1 through the opening 74 and placed on the stage 2 by a robot arm (not shown) (step S10). Then, the gate valve G is closed. Then, the control device 12 controls the exhaust device 73 to adjust a pressure in the processing chamber 1 (step S11).

Next, the control device 12 executes an adsorption process (step S12). In the adsorption process, the valve 152a is opened, and a precursor gas whose flow rate is controlled by the MFC 151a is supplied into the processing chamber 1 through the upper electrodes 16-1 and 16-2. Accordingly, molecules of the precursor gas are adsorbed on the surface of the target object W. In the first embodiment, the adsorption process of step S12 is performed for 0.05 seconds, for example. Then, the valve 152a is closed.

Next, the control device 12 executes a first purge process (S13). In the first purge process, the valve 152b is opened, and a purge gas whose flow rate is controlled by the MFC 151b is supplied into the processing chamber 1 through the upper electrodes 16-1 and 16-2. Accordingly, the molecules of the precursor gas that are excessively adsorbed onto the target object W are removed. The first purge process of step S13 is performed for 0.4 seconds, for example. In the case of high-speed processing in which one film forming cycle of ALD is performed for 0.45 seconds, the first purge process of step S13 is executed for 0.2 seconds, for example. Then, the valve 152b is closed.

Next, the control device 12 controls the allocation setting unit 20 to set the allocation ratio of the radio frequency power to be supplied to the ceiling plate holder 160 of the upper electrode 16-1 and the radio frequency power to be supplied to the ceiling plate holder 160 of the upper electrode 16-2 (step S14). The control device 12 sets the allocation ratio between the radio frequency powers based on the plasma distribution for each film forming cycle specified in the processing recipe stored in the memory. The process of step S14 may be performed before step S12 or step S13 if it is executed before a modifying process of step S15 in which the radio frequency power is actually supplied from the radio frequency power supply 7 to each ceiling plate holder 160.

Next, the control device 12 executes the modifying process (step S15). In the modifying process, the valve 152c is opened, and the modifying gas whose flow rate is controlled by the MFC 151c is supplied into the processing chamber 1 through the upper electrodes 16-1 and 16-2. Then, the radio frequency powers are supplied from the radio frequency power supply 7 to the upper electrodes 16-1 and 16-2 at the allocation ratio set in step S14. Accordingly, the plasma of the modifying gas is generated in the processing space S of the processing chamber 1 while being distributed in response to the allocation ratio set in step 314.

Accordingly, the molecules of the precursor gas that are adsorbed on the surface of the target object W in step S12 are modified to form a film having a predetermined thickness. In step S15, the plasma of the modifying gas is generated for 0.4 seconds, for example. In the case of high-speed processing, the modifying process of step S15 is executed for 0.2 seconds, for example. Then, the supply of the radio frequency powers from the radio frequency power supply 7 to the upper electrodes 16-1 and 16-2 is stopped, and the valve 152c is closed.

Next, the control device 12 executes a second purge process (step S16). In the second purge process, the valve 152b is opened, and a purge gas whose flow rate is controlled by the MFC 151b is supplied into the processing chamber 1 through the upper electrodes 16-1 and 16-2. Accordingly, the reaction by-products adhered to the target object W are removed. The second purge process of step S16 is performed for 0.1 seconds, for example. In the case of high-speed processing, the second purge process of step S16 may be omitted. Then, the valve 152b is closed.

Next, the control device 12 determines whether or not the film forming cycle including steps S12 to S16 has been repeated a predetermined number of times (step S17). The film forming cycle is repeated several tens to hundreds of times, for example. When the film forming cycle is not repeated the predetermined number of times (NO in step S17), the control device 12 executes the process of step S12 again.

On the other hand, when the film forming cycle has been repeated the predetermined number of times (YES in step S17), the gate valve G is opened, and the processed target object W is unloaded from the processing chamber 1 through the opening 74 by the robot arm (not shown) (step S18). Then, the control device 12 determines whether or not an unprocessed target object W remains (step S19). When there is the unprocessed target object W (YES in step S19), the control device 12 executes the process of step S10 again. On the other hand, when no unprocessed target object W remains (NO in step S19), the control device 12 terminates the film forming process shown in the flowchart of FIG. 3.

The first embodiment has been described above. The film forming apparatus 10 of the first embodiment includes the processing chamber 1, the multiple ceiling plate holders 160, the stage 2, the radio frequency power supply 7, the allocation setting unit 20, and the control device 12. The processing chamber 1 accommodates the target object W. Each ceiling plate holder 160 is disposed in the processing chamber 1 and a radio frequency power is supplied to each ceiling plate holder 160. The stage 2 is disposed in the processing chamber 1 and functions as a counter electrode that faces the ceiling plate holder 160. The radio frequency power supply 7 supplies the radio frequency powers to the ceiling plate holders 160 to generate plasma between the ceiling plate holders 160 and the stage 2. Then, the target object W is processed using the generated plasma. The allocation setting unit 20 is disposed between the radio frequency power supply 7 and at least one ceiling plate holder 160, and sets, the power allocations of the radio frequency powers to be supplied from the radio frequency power supply 7 to the ceiling plate holders 160. The control device 12 controls the allocation setting unit 20. Further, the allocation setting unit 20 includes the plurality of series circuits 21 in each of which the impedance circuit and the switching element are connected in series. The series circuits 21 are connected in parallel in the allocation setting unit 20. The control device controls the switching element of each series circuit 21. Accordingly, the plasma distribution can be controlled at a higher speed.

In the above-described first embodiment, the radio frequency power supply 7 generates plasma between ceiling plate holders 160 and the stage 2 in the modifying process of the ALD in which the molecules of the precursor are modified by irradiating plasma to the molecules of the precursor adsorbed on the surface of the target object W. Further, the control device 12 controls the power allocations of the radio frequency powers set by allocation setting unit 20 whenever the modifying process is executed. Accordingly, the plasma distribution can be controlled at a higher speed whenever the modifying process is executed.

Further, in the above-described first embodiment, the switching element is a switch using at least one of a diode and a transistor. Hence, the impedance between the radio frequency power supply 7 and each of the ceiling plate holders 160 can be changed at a higher speed.

Figure 4:
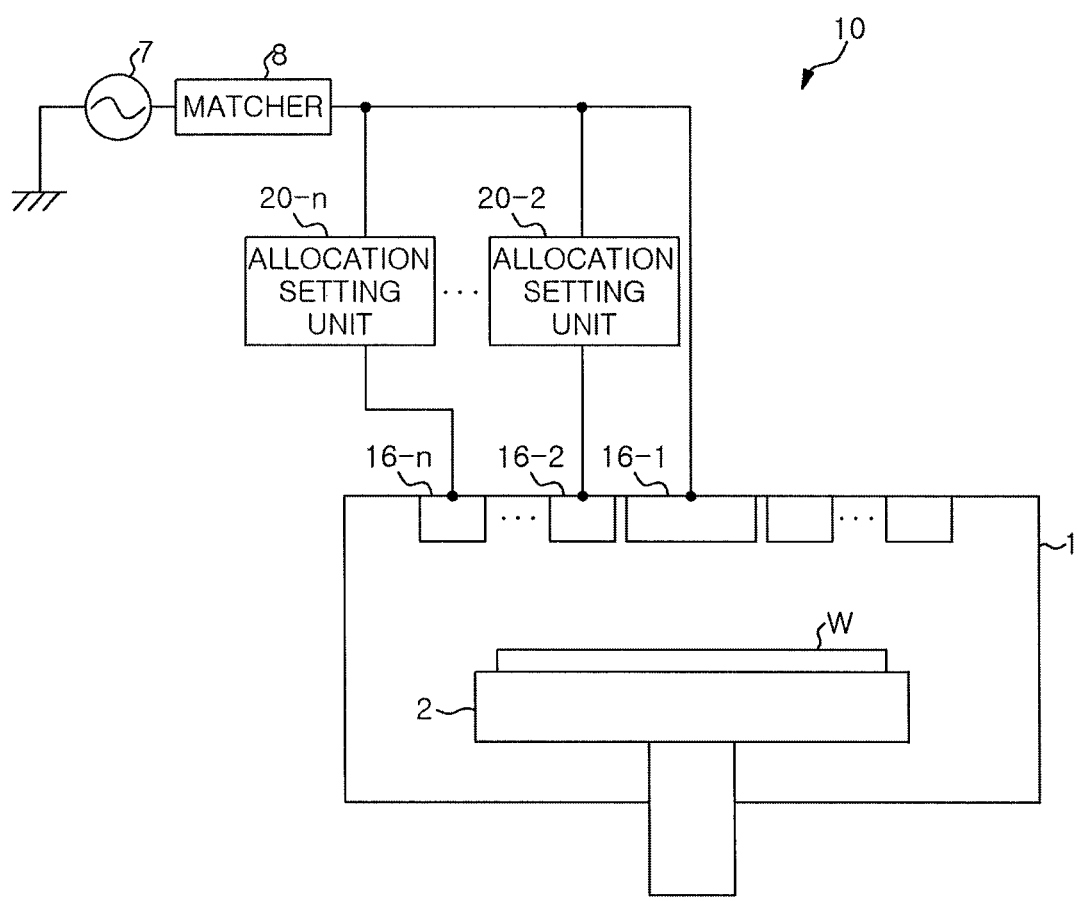
FIG. 4 is a view schematically showing a modification of the film forming apparatus according to the first embodiment of the present disclosure.

In the processing chamber 1 according to the above-described first embodiment, the upper electrode 16 is divided into two upper electrodes 16-1 and 16-2. However, for example, the upper electrode 16 may be divided into three or more upper electrodes 16-1 to 16-n as shown in FIG. 4. FIG. 4 is a view schematically showing a modification of the film forming apparatus 10 according to the first embodiment of the present disclosure.

In the example of FIG. 4, the upper electrodes 16-1 to 16-n have a substantially disc shape, and the central axes of the upper electrodes 16-1 to 16-n coincide with each other. A $k^{th}$ upper electrode 16-k is connected to the matcher 8 through a $k^{th}$ allocation setting unit 20-k. The control device 12 controls the allocation ratio between the radio frequency powers between the matcher 8 and the upper electrodes 16-1 to 16-n by controlling the allocation setting units 20. Accordingly, the plasma distribution in the processing chamber 1 can be controlled more accurately.

Further, the upper electrode 16-1 may be connected to the matcher 8 through the allocation setting unit 20-1. In the example of FIG. 4, the upper electrodes 16-1 to 16-n are divided in a radial direction of a circle about the central axis of the upper electrodes 16-1. However, in another example, the electrodes 16-1 to 16-n may be further divided in a circumferential direction of a circle about the central axis of the upper electrode 16-1.

Second Embodiment

<Configuration of Film Forming Apparatus 10>

Figure 5:
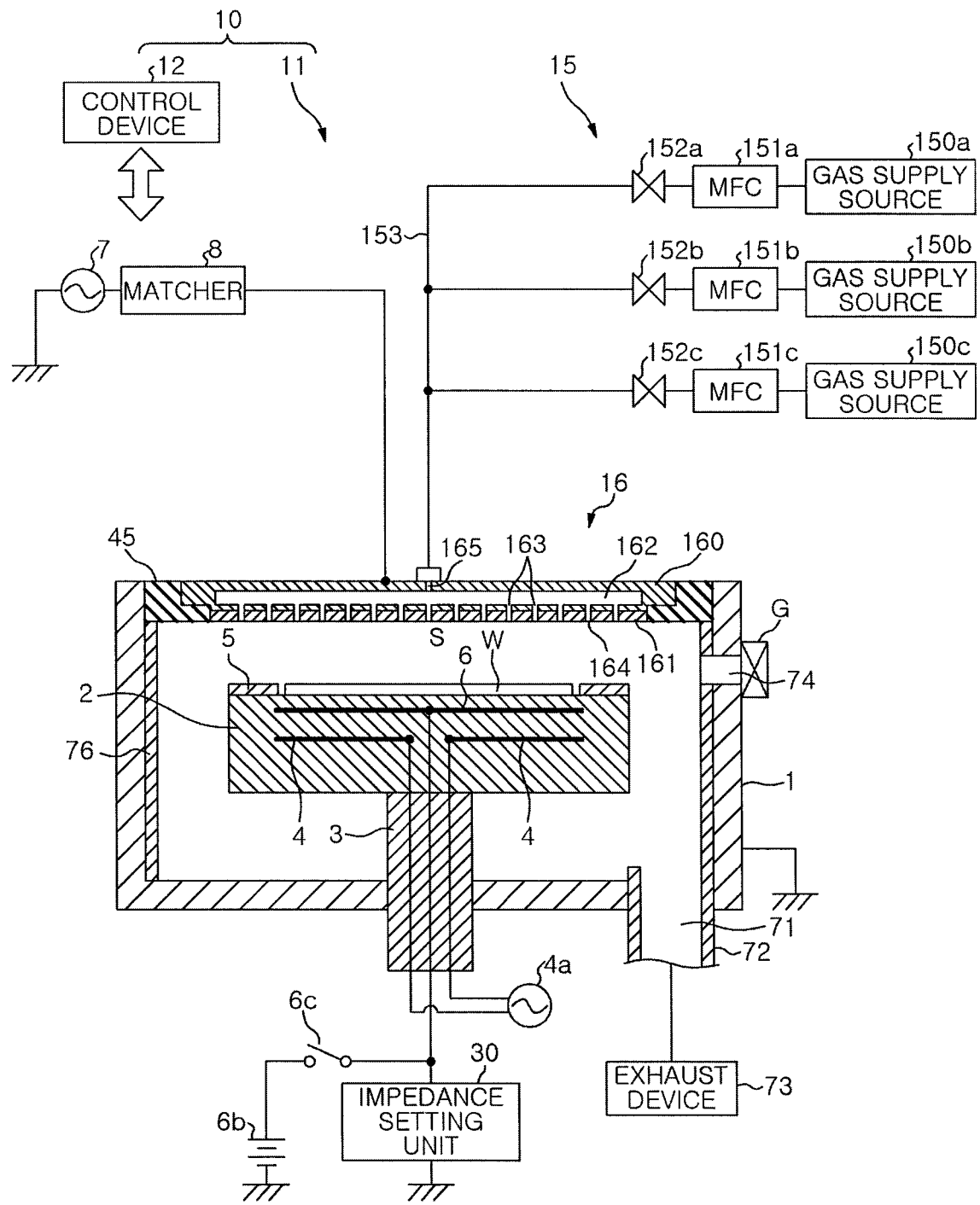
FIG. 5 is a cross-sectional view schematically showing an example of a film forming apparatus according to a second embodiment of the present disclosure.

FIG. 5 is a cross-sectional view schematically showing an example of a film forming apparatus 10 according to a second embodiment of the present disclosure. The film forming apparatus 10 of the second embodiment is different from the film forming apparatus 10 of the first embodiment in that the upper electrode 16 is not divided and the electrode 6 in the stage 2 is grounded through the impedance setting unit 30. Since the other configurations in FIG. 5 are the same or similar to the configurations with the same reference numerals shown in FIG. 1 except for the following differences, the redundant description thereof will be omitted.

The electrode 6 of the stage 2 is grounded through the impedance setting unit 30. The upper electrode 16 is an example of a first electrode, and the sidewall of the processing chamber 1 and the stage 2 are examples of a plurality of second electrodes. By changing the impedance of the impedance setting unit 30, the ratio of the impedance between the stage 2 and the ground potential and the impedance between the sidewall of the processing chamber 1 and the ground potential can be changed.

<Configuration of the Impedance Setting Unit 30>

Figure 6:
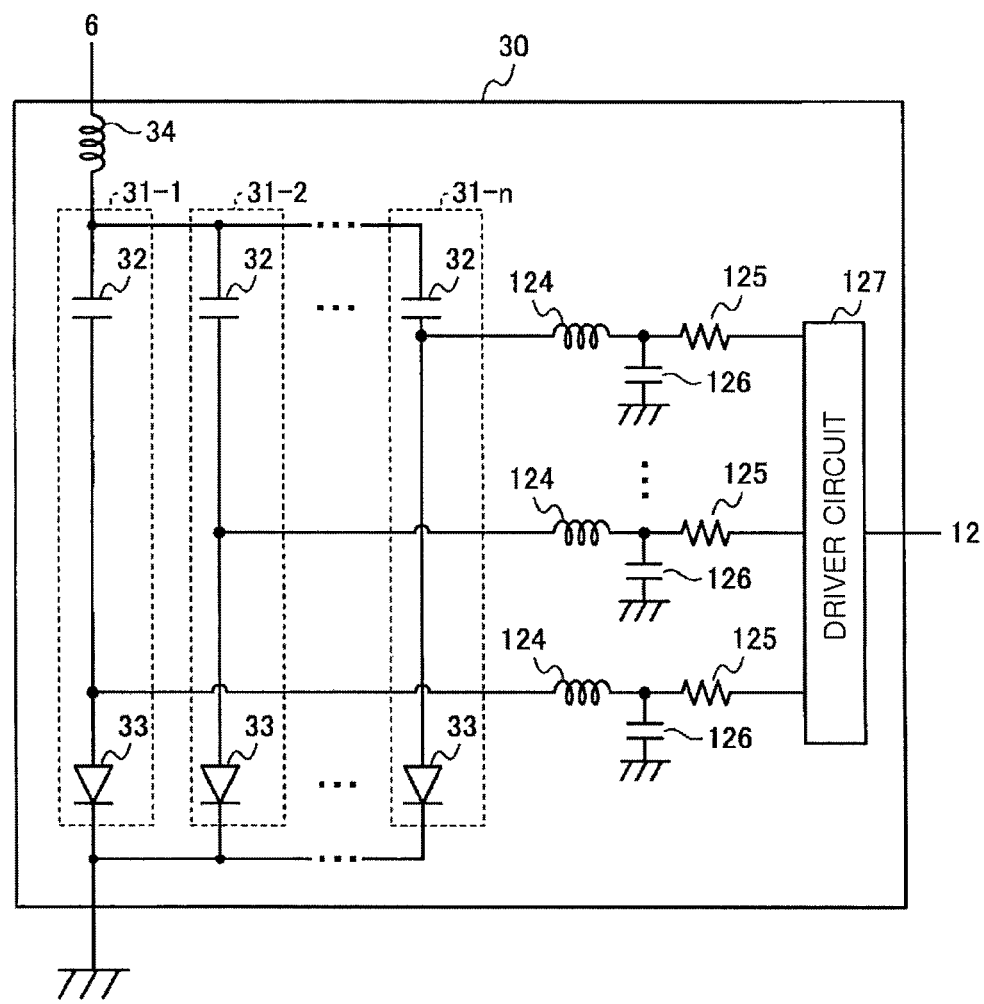
FIG. 6 is a block diagram showing an example of an impedance setting unit.

FIG. 6 is a block diagram showing an example of the impedance setting unit 30. As shown in FIG. 6, for example, the impedance setting unit 30 includes an inductor 34, a plurality of series circuits 31-1 to 31-n connected in series to the inductor 34, a plurality of inductors 124, a plurality of resistors 125, a plurality of capacitors 126, and a driver circuit 127. One end of the inductor 34 is connected to the electrode 6 of the stage 2, and the other end of the inductor 34 is connected to the series circuits 31-1 to 31-n. The series circuits 31-1 to 31-n are connected in parallel to each other between the inductor 34 and the ground potential. In the following description, the series circuit 31 will be collectively referred to as series circuit 31 unless otherwise stated.

Each series circuit 31 has a capacitor 32 and a diode 33. In the second embodiment, the diode 33 is, e.g., a PIN diode. The capacitor 32 is an example of an impedance circuit, and the diode 33 is an example of a switching element. In another embodiment, the capacitor 32 may be replaced with a circuit including at least of a one capacitor and an inductor, for example. Further, the diode 23 may be replaced with a switch using at least one of a diode and a transistor.

In each series circuit 31, one end of the capacitor 32 is connected the inductor 34; the other end of the capacitor 32 is connected to an anode of the diode 33; and a cathode of the diode 33 is grounded. Alternatively, in each series circuit 31, the anode of the diode 33 may be connected to the inductor 34; the cathode of the diode 33 may be connected to one end of the capacitor 32; and the other end of the capacitor 32 may be grounded.

Further, in each series circuit 31, the anode of the diode 33 is connected to the driver circuit 127 through the inductor 124 and the resistor 125 connected in series. A node between the inductor 124 and the resistor grounded through the capacitor 126. The inductor 124 and the capacitor 126 form a low-pass filter (LPF). The driver circuit 127 includes a diode switch driver circuit and a high-voltage DC power supply circuit, and is controlled by the control device 12. In each series circuit 31, a positive bias voltage or a negative bias voltage is applied from the driver circuit 127 through the resistor 125 and the LPF including the inductor 124 and the capacitor 126, so that the diode 33 is turned on or off, and the electrode 6 of the stage 2 is grounded through the inductor 34 and the capacitor 32. Accordingly, the stage 2 is grounded.

In the second embodiment, the constants of the capacitors 32 of the respective series circuits 31 are the same, and the control device 12 controls the number of diodes 33 to be turned on to control the impedance between the stage 2 and the ground potential. Since the sidewall of the processing chamber 1 is grounded, the ratio of the impedance between the sidewall of the processing chamber 1 and the round potential and the impedance between the stage 2 and the ground potential is controlled by controlling the number of diodes 33 to be turned on. Accordingly, the potential of the stage 2 with respect to the potential of the sidewall of the processing chamber 1 is changed, and the distribution of plasma generated in the processing chamber 1 is changed. Therefore, in the processing chamber 1 of the second embodiment as well, the distribution of plasma generated in the processing chamber 1 can be changed at a high speed.

In the second embodiment, similar to the allocation setting unit 20 of the first embodiment, the constant of the capacitor 32 of each series circuit 31 may be set to the capacitance expressed by the above equation (1). Alternatively, the control device 12 may control the impedance between the stage 2 and the ground potential based on the capacitance C specified by the above equation (2).

Similar to the processing chamber 1 of the first embodiment, the processing chamber 1 of the second embodiment configured as described above performs ALD. In the second embodiment, the control device 12 controls the impedance of the impedance setting unit 30 based on the plasma distribution for each film forming cycle specified in the processing recipe stored in the memory before the execution of the modifying process (step S15 in FIG. 3). Accordingly, the ratio of the impedance between the sidewall of the processing chamber 1 and the ground potential and the impedance between the stage 2 and the ground potential is controlled, and the distribution of plasma generated in the modifying process is controlled to a desired distribution.

In the second embodiment, the impedance setting unit 30 is configured as a series circuit of the inductor 34 and the capacitor(s) 32. However, in another embodiment, the inductor 34 may be configured as a combination of a parallel circuit or a series circuit of the inductor and the capacitor. Further, in another embodiment, the impedance setting unit 30 may not include the inductor 34.

The second embodiment has been described above. The film forming apparatus 10 of the second embodiment includes the processing chamber 1, the ceiling plate holder 160, the stage 2, the radio frequency power supply 7, the impedance setting unit 30, and the control device 12. The processing chamber 1 accommodates a target object W. The ceiling plate holder 160 is disposed in the processing chamber 1, and the radio frequency power is supplied to the ceiling plate holder 160. The sidewall of the processing chamber 1 and the stage 2 function as counter electrodes that face the ceiling plate holder 160. The radio frequency power supply supplies the radio frequency power to the ceiling plate holder 160 to generate plasma in a space surrounded by the ceiling plate holder 160, the sidewall of the processing chamber 1, and the stage 2. Then, the target object W is processed using the generated plasma. The impedance setting unit 30 is disposed between the ground potential and the stage 2, and sets the ratio of the impedance between the ground potential and the sidewall of the processing chamber 1 and the impedance between the ground potential and the stage 2. The control device 12 controls the impedance setting unit 30. The impedance setting unit 30 includes the plurality of series circuits 31 in each of which the impedance circuit and the switching element are connected in series. The series circuits 31 are connected in parallel between the stage 2 and the ground potential. The control device 12 controls the switching elements or each series circuit 31. Accordingly, the plasma distribution can be controlled at a higher speed.

The above-described second embodiment may be combined with the above-described first embodiment.

Third Embodiment

<Configuration of Film Forming Apparatus 10>

Figure 7:
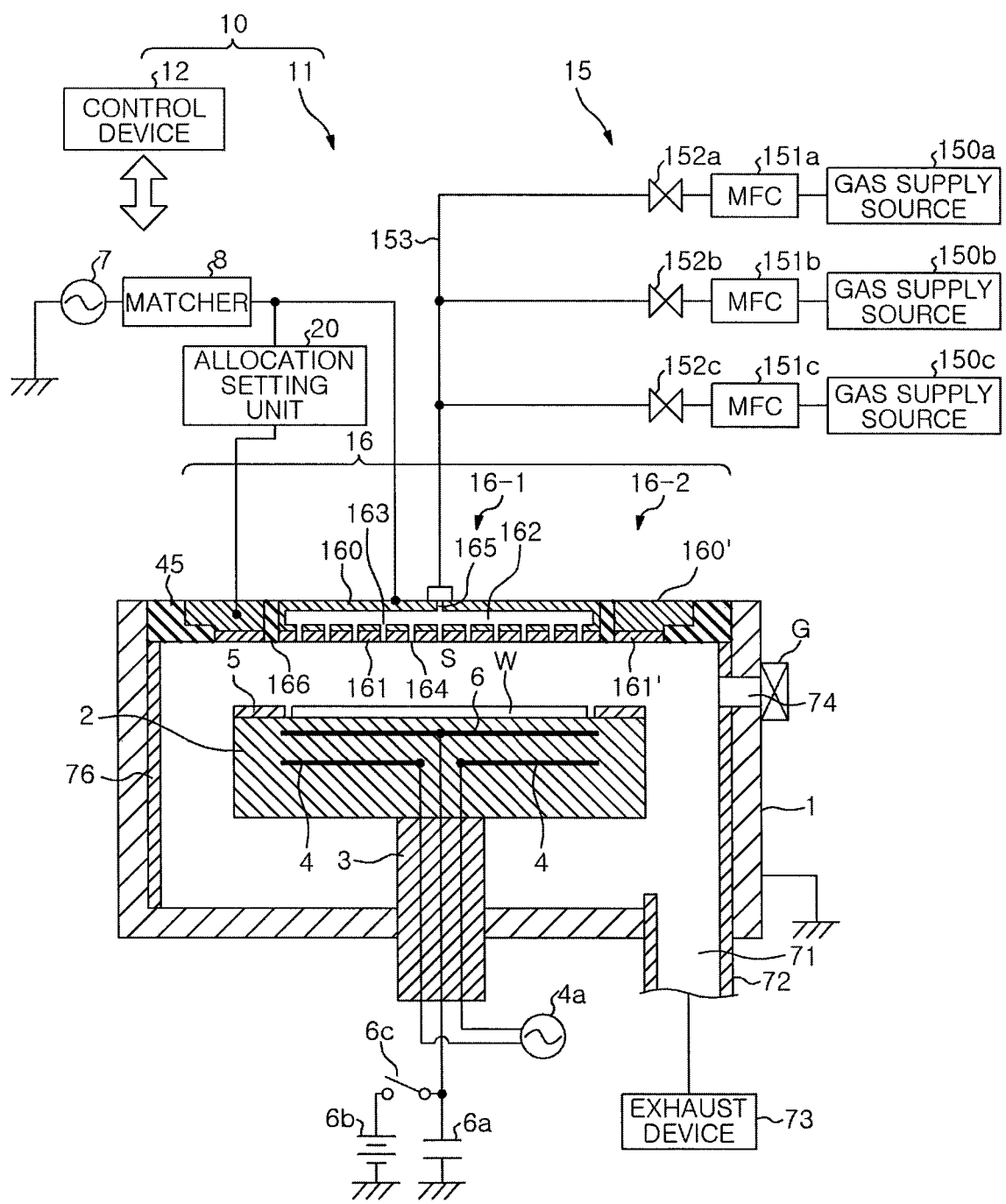
FIG. 7 is a cross-sectional view schematically showing an example of a film forming apparatus according to a third embodiment of the present disclosure.

FIG. 7 is a cross-sectional view schematically showing an example of a film forming apparatus 10 according to a third embodiment of the present disclosure. The film forming apparatus 10 of the third embodiment is different from the film forming apparatus 10 of the first embodiment in that the upper electrode 16-2 is disposed outside a region where the target object W is disposed in a direction along the surface of the target object W. Since the other configurations in FIG. 7 are the same or similar to the configurations with the same reference numerals shown in FIG. 1 except for the following differences, the redundant description thereof will be omitted.

The upper electrode 16-2 has a ceiling plate holder 160' and an upper ceiling plate 161'. The ceiling plate holder 160' is made of, for example, aluminum having are anodically oxidized surface, and the upper ceiling plate 161' is detachably supported below the ceiling plate holder 160'. In the third embodiment, the diffusion space 162, the gas holes 163, and the gas inlet port 165 are not formed in the ceiling plate holder 160', and the gas injection hole 164 is not formed in the upper ceiling plate 161'.

Figure 8:
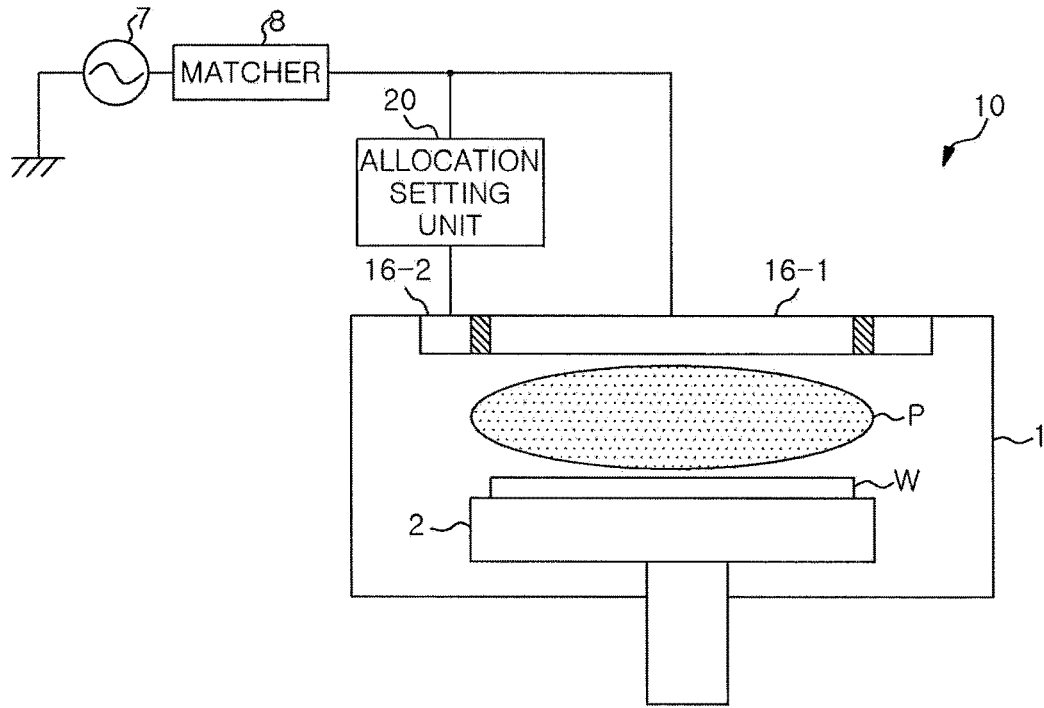
FIG. 8 is a view schematically showing an example of plasma distribution during execution of a modifying process.

In the processing chamber 1 of the third embodiment, for example, plasma P is generated in the processing chamber 1 by the modifying gas supplied through the upper electrode 16-1 in the modifying process, as shown in FIG. 8. FIG. 8 is a view schematically showing an example of the distribution of the plasma P during the execution of the modifying process. Here, the control device 12 controls the allocation setting unit 20 such that the density of the plasma becomes high above the target object W.

Here, the plasma P may contain particles such as reaction by-products and the like. When the modifying process completed, if the supply of the radio frequency powers from the radio frequency power supply 7 to the upper electrodes 16-1 and 16-2 is shut off with the high density of the plasma P above the target object W, the particles contained in the plasma P may fall on the target object W. Accordingly, the quality of the target object W may deteriorate.

Figure 9:
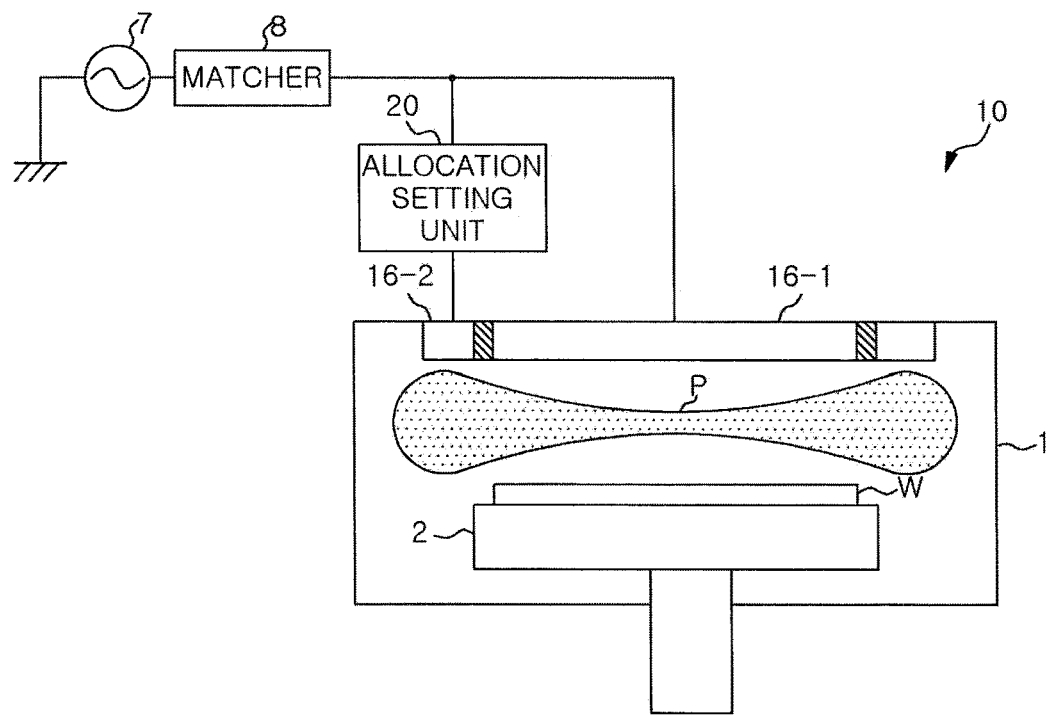
FIG. 9 is a view schematically showing an example of plasma distribution at the end of the modifying process.

Therefore, in the third embodiment, for example, the control device 12 controls the allocation setting unit 20 before the end of the modifying process such that the plasma density becomes high outside the target object W in a direction along the surface of the target object W, as shown in FIG. 9. Then, the control device 12 stops the generation of plasma by shutting off the supply of the radio frequency powers from the radio frequency power supply 7 to the upper electrodes 16-1 and 16-2. FIG. 9 is a view schematically showing an example of the distribution of the plasma P at the end of the modifying process.

Therefore, the generation of the plasma is stopped after most of the particles contained in the plasma P are moved to the outside of the target object W, and the adhesion of the particles to the target object W can be suppressed. Accordingly, the deterioration of the quality of the target object W can be suppressed.

<Film Forming Process>

Since the flowchart showing an example of the film forming process in the third embodiment is the same as the flowchart showing the film forming process in the first embodiment shown in FIG. 3 except for the following description, the illustration thereof will be omitted. Hereinafter, the differences between the film forming process of the third embodiment and the film forming process of the first embodiment will be described with reference to FIG. 3.

In the third embodiment, step S14, the control device 12 controls the allocation ratio of the radio frequency power to be supplied to the upper electrode 16-1 and the radio frequency power to be supplied to the upper electrode 16-2 such that the plasma density becomes high above the target object W.

Figure 10:
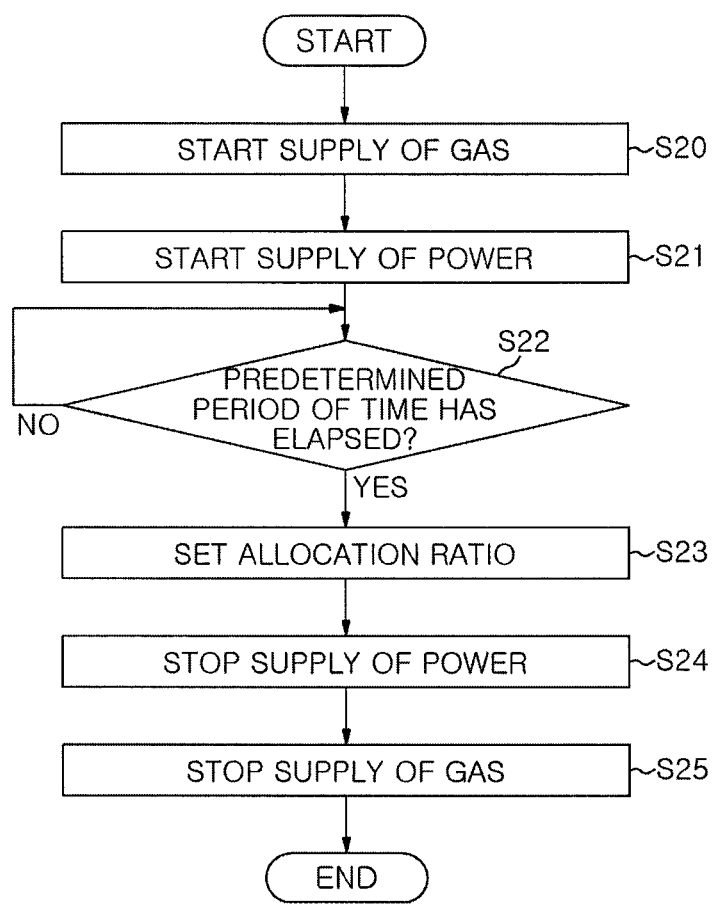
FIG. 10 is a flowchart showing a specific example of a modifying process according to the third embodiment of the present disclosure.

In the modifying process (step S15) of the third embodiment, the process shown in FIG. 10, for example, is executed. FIG. 10 is a flowchart showing a specific example of the modifying process in the third embodiment.

In the modifying process of the third embodiment, first, the valve 152c is opened, and the supply of a modifying gas whose flow rate is controlled by the 151c into the processing chamber 1 through the upper electrodes 16-1 and 16-2 is started (step S20). Then, the radio frequency powers are supplied from the radio frequency power supply 7 to the upper electrodes 16-1 and 16-2 at the allocation ratio set in step S14 (step S21). Accordingly, the plasma of the modifying gas is generated in the processing space S of the processing chamber 1 while being distributed in response to the allocation ratio set in step S14.

Next, the control device 12 determines whether or not a predetermined period of time has elapsed from the generation of the plasma of the modifying gas (step S22). The predetermined period of time is, for example, a period of time required to modify the molecules of the precursor that are adsorbed on the surface of the target object W. When the predetermined period of time has not elapsed from the generation of the plasma of the modifying gas (NO in step S22), the control device 12 executes the process of step S22 again.

On the other hand, when the predetermined period of time has elapsed from the generation of the plasma of the modifying gas (YES in step S22), the device 12 controls the allocation setting unit 20 such that the plasma density becomes high outside the target object W in direction along the surface of the target object W (step S23). Specifically, the control device 12 controls the allocation ratio of the radio frequency power to be supplied to the upper electrode 16-1 and the radio frequency power to be supplied to the upper electrode 16-2 such that the plasma density becomes high outside the target object W in the direction along the surface of the target object W.

After the particles contained in the plasma P are moved to the outside of the target object W the supply of radio frequency powers from the radio frequency power supply to the upper electrodes 16-1 and 16-2 is stopped (step S24). Then, the valve 152c is closed, the supply of the modifying gas into the processing chamber 1 is stopped (step S25), and the modifying process shown in the flowchart shown in FIG. 10 is completed.

The third embodiment has been described above. In the film forming apparatus 10 of the third embodiment, control device 12 controls the power allocations set by the allocation setting unit 20 such that the plasma is concentrated on the outside of the region where the target object h is disposed before the generation of the plasma by the radio frequency power supply 7 is completed. Accordingly, it is possible to prevent the particles contained in the plasma from being adhered to the target object W.

In the second embodiment as well, the impedance setting unit 30 may be controlled such that the plasma density becomes high outside the target object W in the direction along the surface of the target object W before the modifying process is completed.

Fourth Embodiment

<Configuration of Film Forming Apparatus 10>

Figure 11:
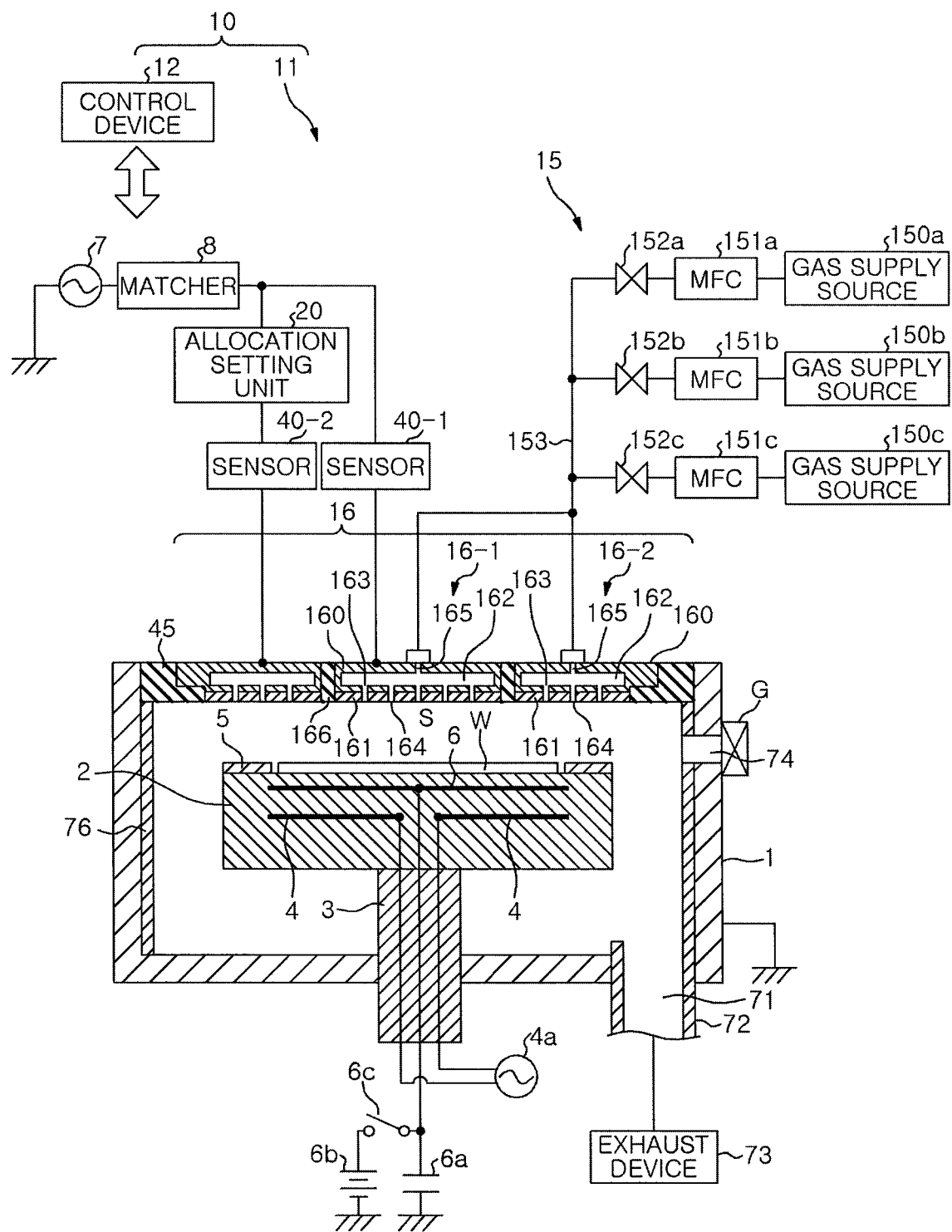
FIG. 11 is a cross-sectional view schematically showing an example of a film forming apparatus according to a fourth embodiment of the present disclosure.

FIG. 11 is a cross-sectional view schematically showing an example of a film forming apparatus 10 according to a fourth embodiment of the present disclosure. The film forming apparatus 10 of the fourth embodiment is different from the film forming apparatus 10 of the first embodiment in that the allocation setting unit 20 is controlled such that the currents are supplied to the upper electrodes 16-1 and 16-2 at a predetermined ratio during the generation of the plasma in the processing chamber 1. Since the other configurations in FIG. 11 are the same or similar to the configurations with the same reference numerals shown in FIG. 1 except for the following differences, the redundant description thereof will be omitted.

A sensor 40-1 for measuring a current supplied from the radio frequency power supply 7 to the ceiling plate holder 160 of the upper electrode 16-1 through the matcher 8 is disposed between the ceiling plate holder 160 of the upper electrode 16-1 and the matcher 8. Further, a sensor 40-2 for measuring a current supplied from the radio frequency power supply 7 to the ceiling plate holder 160 of the upper electrode 16-2 through the matcher 8 and the allocation setting unit 20 is disposed between the ceiling plate holder 160 of the upper electrode 16-2 and the matcher 8. In the following description, the sensor 40-1 and the sensor 40-2 will be collectively referred to as a sensor 40 unless otherwise stated.

The control device 12 acquires a value of the current measured by the sensor 40-1 and a value of the current measured by the sensor 40-2 during the generation of the plasma in the modifying process of the ALP. Then, the control device 12 controls the allocation setting unit 20 such that the ratio of the acquired current values becomes a predetermined ratio. The predetermined ratio is specified in, for example, the recipe stored in the memory of the control device 12. Since the allocation setting unit 20 is controlled based on the currents that are actually supplied to the upper electrodes 16-1 and 16-2, the plasma distribution in the processing chamber 1 can become closer to a desired distribution.

In the fourth embodiment, each sensor 40 measures the current supplied to the upper electrode 16, and the control device 12 controls the allocation setting unit 20 such that the ratio of the measurement values of the currents becomes a predetermined ratio. However, the present disclosure is not limited thereto. In another embodiment, each sensor 40 may measure the power supplied to the upper electrode 16, and the control device 12 may control the allocation setting unit 20 such that the ratio of the measurement values of the powers becomes a predetermined ratio.

<Film Forming Process>

Since the flowchart showing an example of the film forming process in the fourth embodiment is the same as the flowchart showing the film forming process in the first embodiment shown in FIG. 3 except for the following description, the illustration thereof will be omitted. In the fourth embodiment, in step S14, the control device 12 controls the allocation setting unit 20 based on the plasma distribution for each film forming cycle specified in the processing recipe stored in the memory to set an initial allocation ratio between the radio frequency powers.

Figure 12:
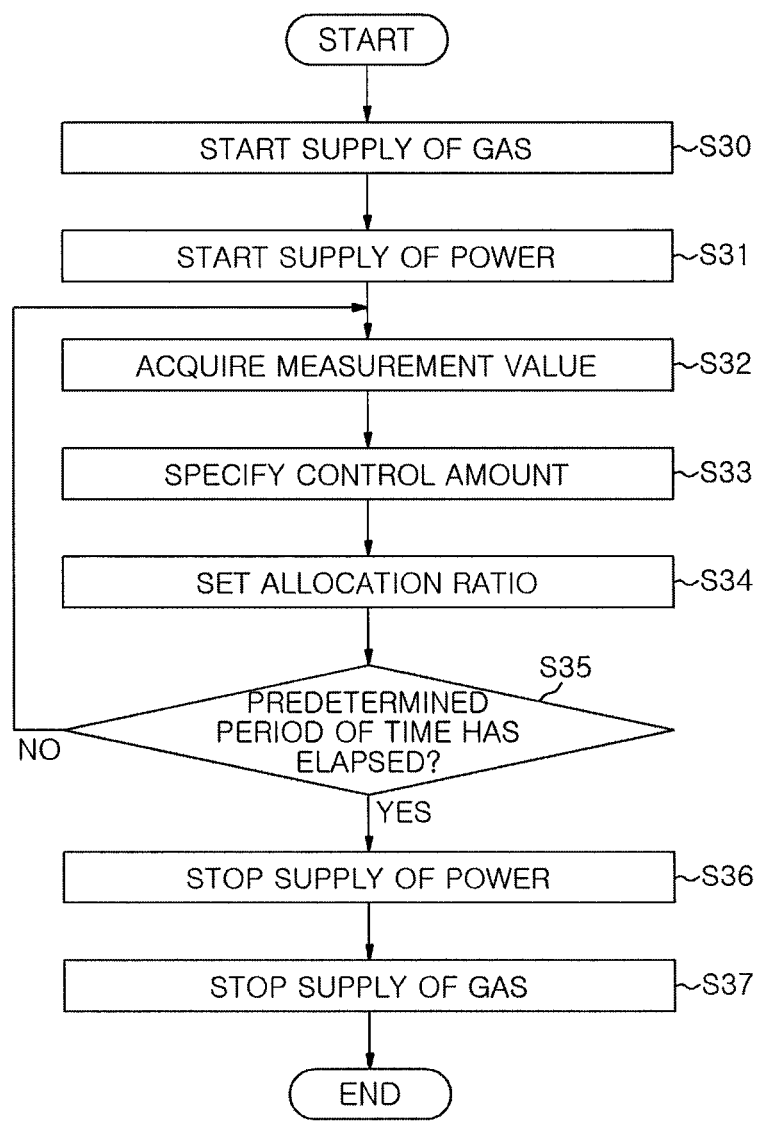
FIG. 12 is a flowchart showing a specific example of a modifying process according to the fourth embodiment of the present disclosure.

In the modifying process (step S15) of the fourth embodiment, the process of FIG. 12 is executed, for example. FIG. 12 is a flowchart showing a specific example of the modifying process in the fourth embodiment.

In the modifying process of the fourth embodiment, first, the valve 152c is opened, and the supply of the modifying gas whose flow rate is controlled by the MFC 151c into the processing chamber 1 through the upper electrodes 16-1 and 16-2 is started (step S30). Then, the radio frequency powers are supplied from the radio frequency power supply 7 to the upper electrodes 16-1 and 16-2 at the initial allocation ratio set in S14 (step S31). Accordingly, the plasma of the modifying gas is generated in the processing space S of the processing chamber 1 while being distributed in response to the initial allocation ratio set in step S14.

Next, the control device 12 acquires a measurement value of the current from each sensor 40 (step S32). Step S32 is an example of an acquisition process. Then, based on the ratio between the measurement values of the currents and the predetermined ratio specified in the recipe, the control device 12 specifies the impedance control amounts of the allocation setting unit 20 that need to be changed to set the ratio between the measurement values of the currents to be equal to the predetermined ratio (step S33). Step S33 is an example of a specifying process.

Next, in order to set the impedance change amounts to correspond to the specified control amounts, the control device 12 controls the allocation setting unit 20 to set the allocation ratio of the radio frequency power to be supplied to the upper electrode 16-1 and the radio frequency power to be supplied to the upper electrode 16-2 (step S34). Step 34 is an example of a control process.

In step S34, when the control amounts indicate an increase in the impedance, the control device 12 may control the allocation setting unit 20 to increase the impedances of the allocation setting unit 20 by a predetermined capacitance $\Delta C$. Similarly, in step S34, when the control amounts indicate a decrease in the impedance, the control device 12 may control the allocation setting unit 20 to reduce the impedances of the allocation setting unit 20 by the predetermined capacitance $\Delta C$.

Next, the control device 12 determines whether or not predetermined period of time has elapsed from the generation of the modifying gas (step S35). The predetermined period of time is, for example, a period of time required to modify the molecules of the precursor adsorbed on the surface of the target object W. If the predetermined period of time has not elapsed from the generation of the plasma of the modifying gas (NO in step S35), the control device 12 executes the process of step S32 again.

On the other hand, when the predetermined period of time has elapsed from the generation of the plasma of the modifying gas (YES in step S35), the supply of the radio frequency powers from the radio frequency power supply 7 to the upper electrodes 16-1 and 16-2 is stopped (step S36). Then, the valve 152c is closed, the supply of the modifying gas into the processing chamber 1 is stopped (step S37), and the modifying process shown in the flowchart shown in FIG. 12 is completed.

The fourth embodiment has been described above. The film forming apparatus 10 of the fourth embodiment includes the multiple sensors 40 that are disposed at the ceiling plate holders 160 and configured to measure the currents supplied to the ceiling plate holders 160, respectively. The control device 12 controls the power allocations of the radio frequency powers set by the allocation setting unit 20 such that the ratio between the currents measured by the respective sensors 40 becomes predetermined ratio. Accordingly, the plasma distribution in the processing chamber 1 can become closer to a desired distribution.

Other Applications

The present disclosure is not limited to the above-described embodiments, and may be variously modified within the scope of the gist of the present disclosure.

For example, in the above-described fourth embodiment, the allocation setting unit 20 is controlled based on the current ratio at the time of supplying the radio frequency powers to the upper electrode 16-1 and the upper electrode 16-2. However, the present disclosure is not limited thereto. For example, in the second embodiment, the sensor 40-1 may be disposed between the impedance setting unit 30 and the ground potential, and the sensor 40-2 may be disposed between the processing chamber and the ground potential. Then, the impedance setting unit 30 may be controlled such that the ratio between the currents or the ratio between the powers measured by the sensors 40 becomes a predetermined ratio.

Further, in each of the above-described embodiments, the film forming apparatus 10 for forming a predetermined laminated film on the target object W using ALD has been described as an example of the plasma processing apparatus. However, the present disclosure is not limited thereto. The present disclosure may be applied to an apparatus for forming a film using plasma, for example, an apparatus for forming a film using chemical vapor deposition (CVD), physical vapor deposition (PVD), or the like. Further, the present disclosure may be applied to an etching apparatus, an atomic layer etching apparatus, a cleaning apparatus, a modifying apparatus, or the like as long as the apparatus performs processing using plasma.

In the film forming apparatus 10 of each of the above-described embodiments, capacitively coupled plasma (CCP) is used as an example of a plasma source. However, the present disclosure is not limited thereto, and the plasma processing may be performed using a plasma source other than the capacitively coupled plasma. The plasma source other than the capacitively coupled plasma may be inductively coupled plasma (ICP) or the like.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

DESCRIPTION OF REFERENCE NUMERALS

P: plasma
S: processing space
W: target object
1: processing chamber
11: apparatus main body
12: control device
15: gas supply mechanism 16: per electrode
160: ceiling plate holder
161: upper ceiling plate
2: stage
20: allocation setting unit
21: series circuit
3: support member
30: impedance setting unit
31: series circuit
40: sensor
5: edge ring
6: electrode
6a: blocking capacitor
6b: DC power supply
6c: switch
7: radio frequency power supply

The invention claimed is:

1. A plasma processing apparatus comprising:
a processing chamber accommodating a target object to be processed;
a plurality of first electrodes disposed inside the processing chamber;
a second electrode disposed inside the processing chamber, the second electrode functioning as a counter electrode that faces the plurality of first electrodes;
a single power supply source configured to supply a first radio frequency power to generate plasma between the plurality of first electrodes and the second electrode and process the target object using the generated plasma;
an allocation setting unit connected to the single power supply source and a first electrode from the plurality of first electrodes but is not connected to another first electrode from the plurality of first electrodes, the allocation setting unit being configured to receive the first radio frequency power and output a second radio frequency power to the first electrode whereas the other first electrode is applied a remaining power of the first radio frequency power; and
a control device configured to control the allocation setting unit by controlling a power allocation of the second radio frequency power output by the allocation setting unit such that a ratio of the remaining power applied to the other first electrode and the second radio frequency power applied to the first electrode matches a predetermined ratio;
wherein the allocation setting unit has a plurality of series circuits, in each of which an impedance circuit and a switching element are connected in series,
the plurality of series circuits are connected in parallel and disposed between the single power supply source and the portion of the plurality of first electrodes, and
the control device is configured to control the number of the switching elements, of the plurality of series circuits, to be turned on to control impedance between the single power supply source and the first electrode of the plurality of first electrodes.

2. The plasma processing apparatus of claim 1, wherein the single power supply source generates plasma between the plurality of first electrodes and the second electrode in a modifying process included in atomic layer deposition (ALD), in which molecules of a precursor adsorbed on a surface of the target object are modified by irradiating the plasma to the molecules of the precursor, and
the control device is configured to control the power allocation in the modifying process.

3. The plasma processing apparatus of claim 2, wherein the control device is configured to control the power allocation of the allocation setting unit such that the plasma is concentrated outside a region where the target object is disposed before the generation of the single plasma by the power supply source is completed.

4. The plasma processing apparatus of claim 3, further comprising:
a plurality of sensors respectively disposed at the plurality of first electrodes, the sensors being configured to respectively measure currents or powers supplied to the plurality of first electrodes,
the control device is configured to control the power allocation set by the allocation setting unit such that a ratio of the currents or a ratio of the powers measured by the sensors becomes a predetermined ratio.

5. The plasma processing apparatus of claim 2, further comprising:
a plurality of sensors respectively disposed at the plurality of first electrodes, the sensors being configured to respectively measure currents or powers supplied to the plurality of first electrodes,
the control device is configured to control the power allocation set by the allocation setting unit such that a ratio of the currents or a ratio of the powers measured by the sensors becomes a predetermined ratio.

6. The plasma processing apparatus of claim 1, wherein the control device is configured to control the power allocation set by the allocation setting unit such that the plasma is concentrated outside a region where the target object is disposed before the generation of the plasma by the single power supply source is completed.

7. The plasma processing apparatus of claim 1, further comprising:
a plurality of sensors respectively disposed at the plurality of first electrodes, the sensors being configured to respectively measure currents or powers supplied to the plurality of first electrodes,
the control device is configured to control the power allocation set by the allocation setting unit such that a ratio of the currents or a ratio of the powers measured by the sensors becomes a predetermined ratio.

8. The plasma processing apparatus of claim 1, wherein each of the switching elements is a switch using at least one of a diode and a transistor.

9. The plasma processing apparatus of claim 1, further comprising:
a plurality of sensors, each of the plurality of sensors connected to a corresponding first electrode from the plurality of first electrodes and configured to respectively measure a current or a power supplied to the corresponding first electrode,
wherein the control device is configured to control the power allocation of the allocation setting unit such that a ratio of currents or a ratio of powers measured by the plurality of sensors becomes a predetermined ratio.

10. A plasma processing apparatus comprising:
a processing chamber accommodating a target object to be processed;
a first electrode disposed inside the processing chamber, a radio frequency power being supplied to the first electrode;
a stage disposed inside the processing chamber;
a plurality of second electrodes disposed inside the processing chamber, the plurality of second electrodes functioning as counter electrodes that face the first electrode;
a power supply source configured to supply the radio frequency power to the first electrode to generate plasma between the first electrode and the plurality of second electrodes and process the target object using the generated plasma;

an impedance setting unit disposed between a ground potential and a second electrode from the plurality of second electrodes but is not connected to another second electrode from the plurality of second electrodes, the impedance setting unit being configured to set an impedance between the ground potential and the second electrode; and a control device configured to control the impedance setting unit by controlling the impedance set by the impedance setting unit such that a ratio of the impedance between the ground potential and the second electrode and an impedance between the ground potential and the other second electrode matches a predetermined ratio, wherein the impedance setting unit has a plurality of series circuits, in each of which an impedance circuit and a switching element are connected in series, the series circuits are connected in parallel, and the control device is configured to control the number of the switching elements, of the plurality of series circuits, to be turned on to control impedance between the stage and the ground potential.

11. The plasma processing apparatus of claim 10, wherein each of the switching elements is a switch using at least one of a diode and a transistor.

12. A plasma processing method for a plasma processing apparatus, wherein the plasma processing apparatus includes:

a processing chamber accommodating a target object to be processed;

a plurality of first electrodes disposed inside the processing chamber;

a second electrode disposed inside the processing chamber, the second electrode functioning as a counter electrode that faces the plurality of first electrodes;

a single power supply source configured to supply a first radio frequency power to generate plasma between the plurality of first electrodes and the second electrode and process the target object using the generated plasma;

an allocation setting unit connected to the single power supply source and a first electrode from the plurality of first electrodes but is not connected to another first electrode from the plurality of first electrodes, the allocation setting unit being configured to receive the first radio frequency power and output a second radio frequency power to the first electrode whereas the other first electrode is applied a remaining power of the first radio frequency power;

a plurality of sensors respectively disposed at the plurality of first electrodes, the sensors being configured to respectively measure currents or powers supplied to the plurality of first electrodes; and a control device configured to control the allocation setting unit, wherein the allocation setting unit has a plurality of series circuits in each of which an impedance circuit and a switching element are connected in series, and the plurality of series circuits are connected in parallel and disposed between the single power supply source and the portion of the plurality of first electrodes, the plasma processing method executed by the control device comprising:

an acquisition process of acquiring measurement values of the currents or measurement values of the powers measured by the sensors at the time of generating the plasma by the single power supply source;

a specifying process of specifying respective control amounts of a power allocation of the allocation setting unit such that a ratio of the remaining power applied to the other first electrode and the second radio frequency power applied to the first electrode matches a predetermined ratio based on the acquired measurement values of the currents or measurement values of the powers; and a control process of controlling, based on the specified control amounts, the number of the switching elements, of the plurality of series circuits, to be turned on to control impedance between the single power supply source and the portion of the first electrodes.

* * * * *